(12) United States Patent
Ispir

(10) Patent No.: US 8,296,713 B2
(45) Date of Patent: Oct. 23, 2012

(54) METHOD AND APPARATUS FOR SYNTHESIZING PIPELINED INPUT/OUTPUT IN A CIRCUIT DESIGN FROM HIGH LEVEL SYNTHESIS

(75) Inventor: Mustafa Ispir, Cayyolu Ankara (TR)

(73) Assignee: Synopsys, Inc., Mountain View, CA (US)

( * ) Notice: Subject to any disclaimer, the term of this patent is extended or adjusted under 35 U.S.C. 154(b) by 107 days.

(21) Appl. No.: 12/894,902

(22) Filed: Sep. 30, 2010

(65) Prior Publication Data

US 2012/0084067 A1     Apr. 5, 2012

(51) Int. Cl.
*G06F 17/50* (2006.01)

(52) U.S. Cl. ........................................... 716/132
(58) Field of Classification Search ............... 716/132
See application file for complete search history.

(56) References Cited

U.S. PATENT DOCUMENTS

| | | | |
|---|---|---|---|
| 7,284,228 B1 * | 10/2007 | Haratsaris | 716/117 |
| 7,760,718 B2 * | 7/2010 | Kamath | 370/386 |
| 2001/0029600 A1 | 10/2001 | Lee et al. | |
| 2003/0188299 A1 * | 10/2003 | Broughton et al. | 717/141 |
| 2004/0030782 A1 * | 2/2004 | Nakahara | 709/226 |
| 2004/0143560 A1 | 7/2004 | Zhu | |
| 2007/0208677 A1 | 9/2007 | Goldberg et al. | |
| 2008/0228764 A1 | 9/2008 | Soogoor | |
| 2008/0244500 A1 | 10/2008 | Solomon | |
| 2009/0052321 A1 * | 2/2009 | Kamath | 370/235 |
| 2009/0070550 A1 | 3/2009 | Solomon | |
| 2009/0070721 A1 | 3/2009 | Solomon | |
| 2009/0089035 A1 | 4/2009 | Solomon | |
| 2010/0125820 A1 | 5/2010 | Ispir | |
| 2011/0254833 A1 * | 10/2011 | McDaniel et al. | 345/419 |
| 2012/0035878 A1 * | 2/2012 | Phatak | 702/123 |
| 2012/0065956 A1 * | 3/2012 | Irturk et al. | 703/21 |

OTHER PUBLICATIONS

Luthra et al, "Interface Synthesis Using Memory Mapping for an FPGA Platform", Center for Embedded Computer Systems, University of CA, at Irvine, Dept. of Computer Science and Engineering, University of CA, at San Diego, 6 pages.

Coussy et al., "An Introduction to High-Level Synthesis", 0740-7475/09/ (c) 2009 IEEE, Copublished by the IEEE CS and the IEEE CASS, IEEE Design & Test of Computers, 10 pages.

Martin et al., "High-Level Synthesis: Past, Present, and Future", 0740-7475/09/ (c) 2009 IEEE, Copublished by the IEEE CS and the IEEE CASS, IEEE Design & Test of Computers, 8 pages.

(Continued)

*Primary Examiner* — Suchin Parihar
(74) *Attorney, Agent, or Firm* — Blakely, Sokoloff, Taylor & Zafman LLP; Judith A. Szepesi

(57) ABSTRACT

A method and apparatus for synthesizing pipelined input/output in a circuit design from high level synthesis is described. In one example, an operation is selected to be performed by a circuit, the operation including a plurality of partial operations of different types. The partial operations are ordered based on the ordering of the variables. A plurality of hardware components for performing the operations are represented with a data flow graph having edges and nodes, the edges and nodes being connected based on the ordering of partial operations. A plurality of solutions are simulated for performing the operations as hardware component combinations represented as paths on the data flow graph. For each solution, a cost including a number of edges and nodes traversed on the data flow graph is determined, and a solution is selected with the lowest cost as a hardware component combination for a circuit.

15 Claims, 12 Drawing Sheets

OTHER PUBLICATIONS

Dorigo, Marco, et al, "Ant Colony Optimization: Artificial Ants as a Computational Intelligence Technique," IEEE Computational Intelligence Magazine, Nov. 2006, pp. 28-39.

Merkle, Daniel, et al, "An Colony Optimization for Resource-Constrained Project Scheduling," IEEE Transactions on Evolutionary Computation, vol. 6, No. 4, Aug. 2002, pp. 333-346.

PCT/US11/50081, International Search Report and Written Opinion, Mailing Date Jan. 17, 2012, 16 pages.

Wang, Gang, et al, "Ant Colony Optimizations for Resource and Timing Constrained Operation Scheduling," IEEE Transactions on Computer-Aided Design of Integrated Circuits and Systems, Revised Jun. 6, 2006, pp. 1-20.

* cited by examiner

METHOD AND APPARATUS FOR SYNTHESIZING PIPELINED INPUT/OUTPUT IN A CIRCUIT DESIGN FROM HIGH LEVEL SYNTHESIS

FIELD OF ART

The disclosed embodiments relate to circuit design, and more particularly to selecting solutions for time constrained scheduling of operations for a circuit design.

BACKGROUND

For the design of digital circuits (e.g., on the scale of Very Large Scale Integration (VLSI) technology), designers often employ computer aided techniques. Standard languages such as Hardware Description Languages (HDLs) have been developed to describe digital circuits to aid in the design and simulation of complex digital circuits. Several hardware description languages, such as VHDL (Very high-speed integrated circuit HDL) and Verilog HDL, have evolved as industry standards. VHDL and Verilog HDL are general purpose hardware description languages that allow definition of a hardware model at the gate level, the register transfer level (RTL), or the behavioral level using abstract data types. As device technology continues to advance, various product design tools have been developed to adapt HDLs for use with newer devices and design styles.

In designing an integrated circuit with an HDL code, the HDL source code describes the circuit elements, and a synthesis process produces an RTL netlist from this source code. The RTL netlist is typically a technology independent netlist, in that it is independent of the technology/architecture of a specific vendor's integrated circuit, such as a field programmable gate array (FPGA) or an application-specific integrated circuit (ASIC). The RTL netlist corresponds to a schematic representation of circuit elements (as opposed to a behavioral representation). A mapping operation is then performed to convert from the technology independent RTL netlist to a technology specific netlist which can be used to create circuits in the vendor's technology/architecture. Field Programmable Gate Array (FPGA) vendors use different technologies and architectures to implement logic circuits within their integrated circuits. This results in a final netlist which is specific to a particular vendor's technology and architecture.

High Level Synthesis (HLS) is a process of converting the behavioral descriptions of HLD (High Level Description) to register transfer level (RTL) descriptions. HLS is typically done with a set of design goals and constraints. So while there may be many different ways to implement the behavior of the HLD, HLS seeks to do so while minimizing particular defined costs. The defined costs are typically things such as cycle time, part count, silicon area, power, interconnections, pin count, etc. The constraints are typically driven by form factors, packaging constraints, interoperability and similar concerns. HLS can be described as compiling a specification written in a high level language (HLL), allocating hardware resources to the operations in the specification and then generating the RTL description.

To generate the RTL description, the HLS schedules the operations, allocates the operation to particular functional hardware units, allocates any variables to storage elements, and allocates any data transfers to communications buses that connect the functional units to storage registers and input/output interfaces. In many devices, including Digital Signal Processors (DSP) the RTL description provides inputs and outputs of the system and the algorithms that are to be performed. These are described as frames. Frame based algorithms are described by using frame data. The input data is received in frames and the output data is produced in frames.

Frame based algorithms are typically synthesized in HLS as follows: First the device collects the frame data from an input stream; then the device processes the frame data; and finally the device sends the output frame as an output stream. The frame synthesis includes scheduling of the operations and binding the operations to hardware to obtain an optimized device design. This methodology suffers from low throughput.

Ant Colony Optimization (ACO) is a recent optimization method that has been applied to many different problems. In ACO, each ant constructs a candidate solution and leaves pheromones according to the cost associated with each solution it constructs. ACO allows several different solutions to be found. These can then be compared to each other to find an optimum solution. ACO, however, has distinct limitations that prevent it from being directly applied to existing solution methodologies.

SUMMARY OF THE DESCRIPTION

A method and apparatus for synthesizing pipelined input/output in a circuit design from high level synthesis is described. In one example, an operation is selected to be performed by a circuit, the operation including a plurality of partial operations of different types. Variables are identified to be used by the partial operations. The variables are ordered based on a time order in which the variables are used by the partial operations. The partial operations are ordered based on the ordering of the variables. A plurality of hardware components for performing the operations are represented with a data flow graph having edges and nodes, the edges and nodes being connected based on the ordering of partial operations. A plurality of solutions are simulated for performing the operations as hardware component combinations represented as paths on the data flow graph. For each solution, a cost including a number of edges and nodes traversed on the data flow graph is determined, and a solution is selected with the lowest cost as a hardware component combination for a circuit.

BRIEF DESCRIPTION OF THE DRAWINGS

The disclosed embodiments are illustrated by way of example and not limitation in the figures of the accompanying drawings in which like references indicate similar elements.

DETAILED DESCRIPTION

At least one embodiment of the disclosed embodiments seeks to use an ant colony optimization (ACO) method to improve the design of an integrated circuit. In one embodiment, an additional cost is added to the cost of a candidate solution to improve the selection of additional candidate solutions.

High Level Synthesis (HLS) is a process that is used to convert behavioral descriptions of a complex integrated circuit system to RTL descriptions that can be used to construct the system. Some of the behavioral descriptions may include frame synthesis, in which an input frame and a corresponding output frame are described.

Figure 1:
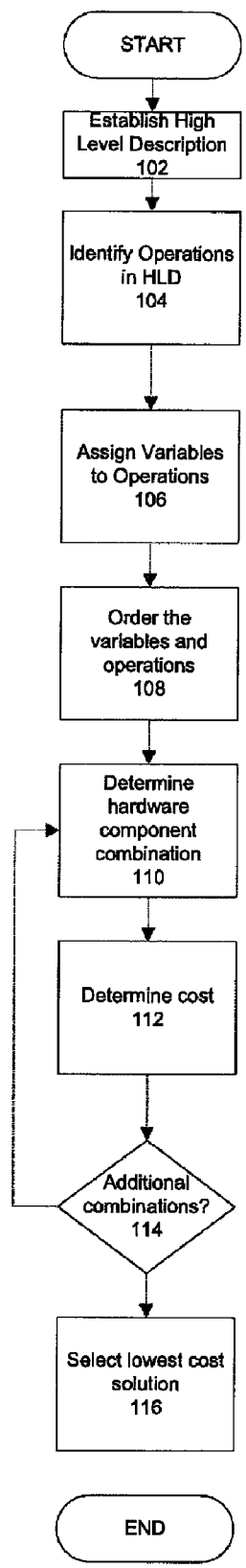
FIG. 1 is an example of a process flow diagram for performing high level synthesis for circuit design based on a high level description.

A basic process for designing a circuit with HLS is shown in the context of FIG. 1. The process of FIG. 1 starts with establishing the high level description, for example in HLD 102. This description will provide the operations to be performed by the circuit, which may in one embodiment, include one or more types of partial operations. A partial operation is a portion of a larger operation that is performed to complete the larger operation. For a multiplication operation, the partial operations may include additions and register shifts. Embodiments can be applied to any type of operations whether complete or partial. All operations whether full or partial, will be referred to herein simply as operations.

The operations in the HLD are identified at 104 and variables are assigned to the operations at 106. The variables for the operations are identified and ordered based on the time order in which they will be used. The operations can be ordered based on this same time order at 108. In one embodiment hardware components for performing these operations can be defined at 110.

There are different ways to determine the best combination of hardware components required to perform all of the operations. In one embodiment, different solutions for performing the operations are simulated as hardware component combinations at 114. Each solution is assigned a cost at 112 and the solution with the lowest cost is selected at 116 as the hardware component combination for the final circuit design. The selection and calculation of costs becomes an important part of finding a solution.

Frame-Based Input/Output

When the HLD to RTL system is applied to input and output data frames, the assignment of variables to hardware components becomes more complicated. If frames are processed individually, the resulting device described by the register transfer level description may be slower than necessary. The efficiency and speed of the device can be increased by using pipelined structures to process the frames. In a pipeline structure, the processing elements are arranged so that the output of each element is the input to the next, and so that one operation is performed per cycle.

A particular difficulty in frame synthesis for fully pipelined architectures is mapping or binding the frame data to memory registers. The design of the memory mapping drastically affects the cost of the multiplexing logic and the control logic that is required to support the pipelined architecture. If the memory mapping is performed first, then there must be assumptions about the sequence of operations. These assumptions may turn out to be wrong after the scheduling algorithm is completed. On the other hand, if the scheduling is done first, then the scheduling algorithm may produce a solution which makes it difficult to map the variables to at least some of the memory blocks. Therefore, in one embodiment, the scheduling algorithm to support pipelining is linked to the corresponding binding algorithms and the memory mapping is performed as part of the scheduling.

By integrating the frame synthesis with scheduling and binding algorithms, the Input/Output frame synthesis can be accommodated at the scheduling phase. In addition, input frame data that comes in a predetermined order, and input frame data that has no determined order can both be accommodated.

Scheduling and binding algorithms can be defined using a graph structure or data flow graph. Such a graph structure can be represented as (V, E, W). V is the set of operations v. Each operation has an operation type, which provides the hardware unit types upon which the corresponding operation can be executed. As noted above, the term operation includes partial operations. E is the set of edges e which are the connections from one operation to another. W is a function which gives the register number w of an edge.

Figure 2:
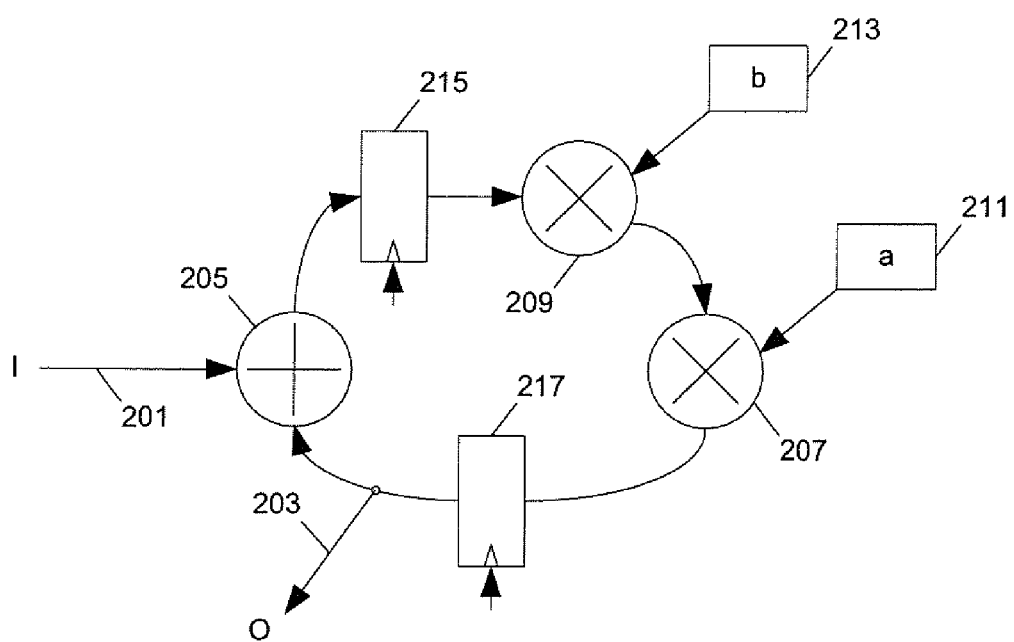
FIG. 2 is an example representation of a data flow graph for circuit design.
Figure 3:
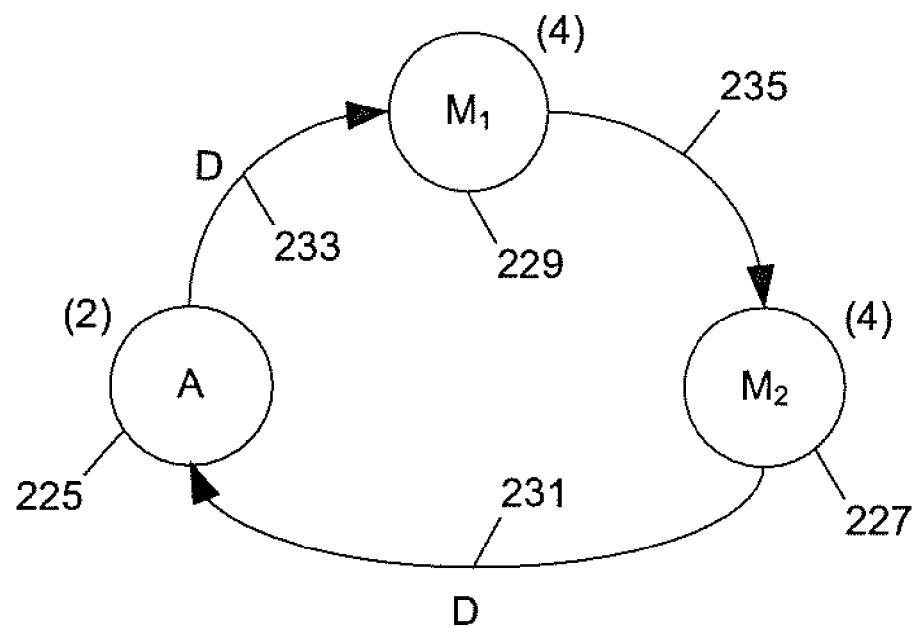
FIG. 3 is an alternative example representation of the data flow graph of FIG. 2.

Data flow graphs can be composed of nodes that represent the combinational computation units and edges interconnecting the nodes. Delays (e.g. registers) are represented as weights (w) on the edges. Each node has an execution time associated with it. Examples of data flow graphs are shown in FIGS. 2 and 3 which illustrate a method to construct a data flow graph for retiming. FIGS. 2 and 3 are two different representations of the same graph so that, for example, adder 205 and 225 are the same adder. The combinational computation units (e.g., adder 205, multipliers 207 and 209) in FIG. 2 are represented as computation nodes (e.g., nodes 225, 227 and 229 in FIG. 3). FIG. 2 has an input 201 and an output 203. The same path applies to FIG. 3.

The execution time of the combinational computation units can be represented by the computation time of the associated nodes. For example, node 225 may have a computation time of 2 ns, which is required by adder 205; and each of nodes 227 and 229 may have a computation time of 4 ns (nanoseconds), which is required by a multiplier (e.g., 209 or 207). Edges represent connections between the computation units. Edge 231 represents the connection between multiplier 207 and adder 205. Edge 231 has a weight of 1, representing register 217 (or the one clock cycle latency due to register 217). Similarly, edge 233 has a one clock cycle latency due to register 215. Edge 235 represents the connection between multipliers 209 and 207; and, there is no delay associated with edge 235.

The data flow graph can be used to compare paths and latencies. For example, in FIG. 3, the path from node 229 to node 227 contains edge 235 that has zero delay, but the path from node 229 to node 227 takes the longest computation time (e.g., 8 ns, of which 4 ns are for node 229 and 4 ns for node 227). Thus, the minimum clock period for the circuit in FIG. 2 is 8 ns. In FIG. 3, the delay on edge 233 can be moved to edge 235 so that the critical path becomes the path between nodes 225 and 229, which takes only 6 ns of computation time. Thus, moving the delay from edge 233 to edge 235, which can be implemented by moving register 215 from between adder 205 and multiplier 209 to between multipliers

209 and 207, allows the modified (retimed) circuit to be operated at a reduced delay of 6 ns.

A timing model for a circuit module can be constructed by breaking down the module into registers and combinational computing elements and assigning one node to each combinational computing element. The timing model of each hardware module is a combination of the timing models of the combinational computation units, delays, and interconnections. The aggregation of the set of nodes and edges used in the translation of a particular hardware module is effectively the timing model (data flow graph) of that hardware module.

While a data flow graph can be represented by diagrams of the type shown in FIGS. 2 and 3, a data flow graph can also be represented in other ways, including by tables, text with metadata, and mathematical equations. In the examples above, V, the set of values for v, are represented by the nodes, E, the set of values for e, are represented by the edges between nodes, and W, the set of values for w, are represented by the registers on some of the edges.

Input and output frame data represents the input and the output data for a circuit that uses framed data. The data frames can be one dimensional or multi-dimensional. Embodiments are described in the context of a one dimensional frame. However, the same principles can be used to extend the principles to more dimensions. A one dimensional frame (F) can be represented as a set of variables $\{v_1, v_2, v_n\}$, where n is the size of frame (|F|).

A pseudo code of a transformation algorithm to generate RTL specifications for a given data flow graph (V, E, W) can be represented as follows:

```
for each input frame F
do
        define a unique operation type, t
        for each variable v ∈ F
        do
            create a new operation op
            set operation type of op as t
            add op to V
            for each opConsume ∈ V
            do
                if opConsume uses the v
                do
                    create an edge e from op to opConsume
                    add e to the set E
                    set W(e) to zero
                end
            end
        end
end
for each output frame F
do
        define a unique operation type, t
        for each variable v ∈ F
        do
            create a new operation op
            set operation type of op as t
            add op to the V
            for each opSource ∈ V
            do
                if opSource produces the v
                do
                    create an edge e from opSource to op
                    add e to the set E
                    set W(e) to zero
                end
            end
        end
end
```

In the above process op is a variable name that refers to a newly created operation for a variable of the frame. OpConsume refers to an operation which takes a variable from the input frame as its input. OpSource refers to an operation which produces a variable of an output frame as its output.

The above transformation may be performed for each variable of a frame. This provides a set of edges E that can be used to synthesize the frame input/output (I/O). With the help of transformations such as those above, frame synthesis problems can be solved while meeting scheduling and binding objectives. First, since each frame has its own unique operation type, only one hardware unit can be assigned to a whole frame of data. This automatically converts the frame data to fully pipelined serial data. The memory and multiplexing cost of the synthesized frame can also be minimized.

The transformation described above can be used for any serial input sequence. If the serial sequence is predetermined, then the order of the sequence can be transformed to the schedules. In other words, the operations which are produced by frame transformation are scheduled as a pre-step of the scheduling algorithm. The pseudo code of this pre-step can be represented as follows:

```
for each op ∈ V
do
        if op is produced to represent variable v of frame F
        do
                set schedule of op to the order of the v in the sequence of F
        end
end
```

Figure 4:
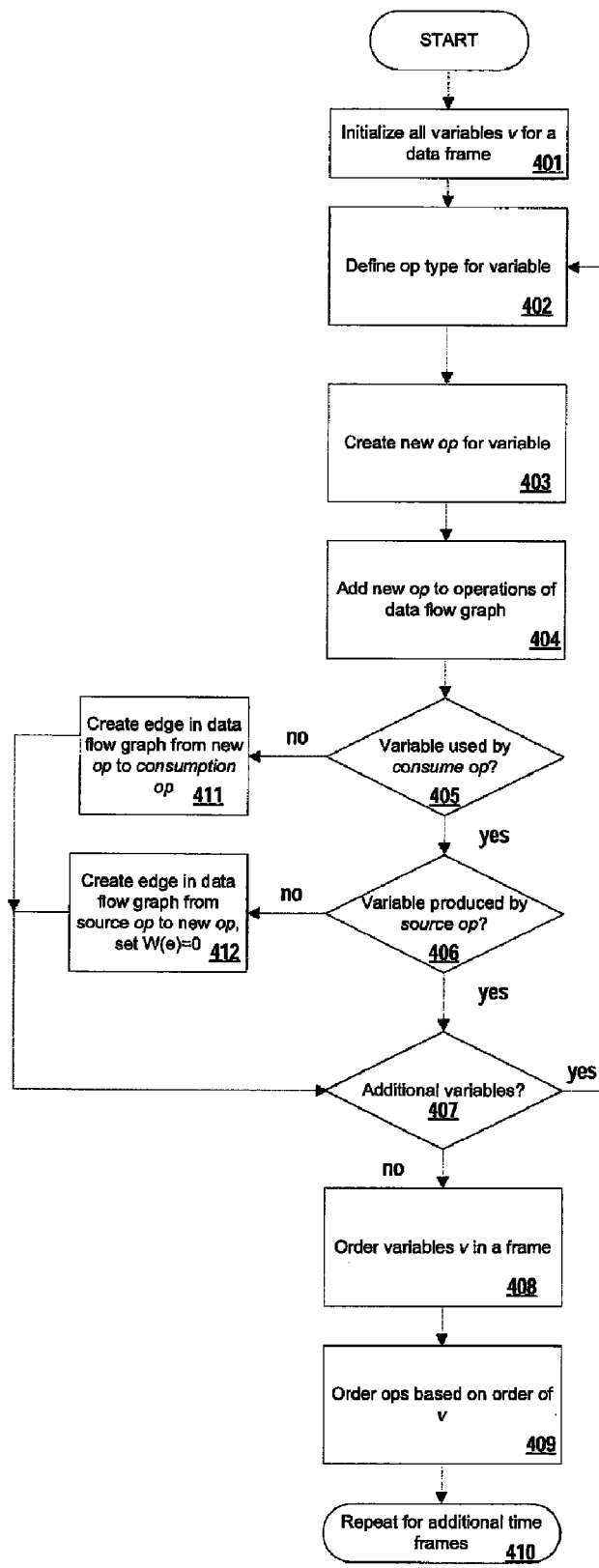
FIG. 4 is a process flow diagram for one embodiment for pipelining operations for a circuit design using input and output data frames.

FIG. 4 shows a process flow diagram corresponding to one embodiment of the pseudocode example shown above. In FIG. 4 at 401, the variables from the input data frame of the high level description (HLD) are initialized for all of the variables v of the data frame. At 402, operation types are defined for each of the variables in the HLD. At 403, a new operation (op) is created for one of the variables. As mentioned above, op is a variable name that refers to a newly created operation for the variable of the frame. At 404, the new op is added to the operations of the data flow graph.

At 405, it is determined whether the variable is used by a ConsumeOp. A ConsumeOp refers to an operation which takes a variable from the input frame as its input. If a variable is not used by a consume operation, then an edge is created in the data flow graph from the new operation created at 403 to a consume operation. The process flow then continues to 407 to determine whether there are any additional variables.

If the variable is used by a consume operation then it is determined at 406 whether the variable is produced by a SourceOp. A source operation is an operation that produces a variable of the output frame. If the variable is not produced by a source operation, then at 412, an edge is created in the data flow graph from a source operation to the new operation created for that variable at 403. In addition, the weight on that edge can be set at 0. After creating the edge, then the process continues to 407 to determine if there are any additional variables.

If the variable is produced by the source operation then at 407, it is determined whether there are any additional variables. If there are additional variables, then the process flow returns to 402 to define an operation type for the next variable. In one embodiment, this process is repeated for all of the variables of an input data frame until all of the defined variables have been bound to consume operations and bound to source operations.

After all the variables have been defined and connected to operations the process continues to 408, the variables can be ordered into a frame. In one embodiment this is done using conventional methodologies.

At 409, the operations can be ordered based on the order of the variables. At 410 this process can be repeated for all of the additional input time frames. After all the input time frames have been characterized and defined in the data flow graph and bound to operations, and after the operations have been ordered, in one embodiment this information can be used to determine hardware component combinations as suggested in FIG. 2 at 210.

Figure 5:
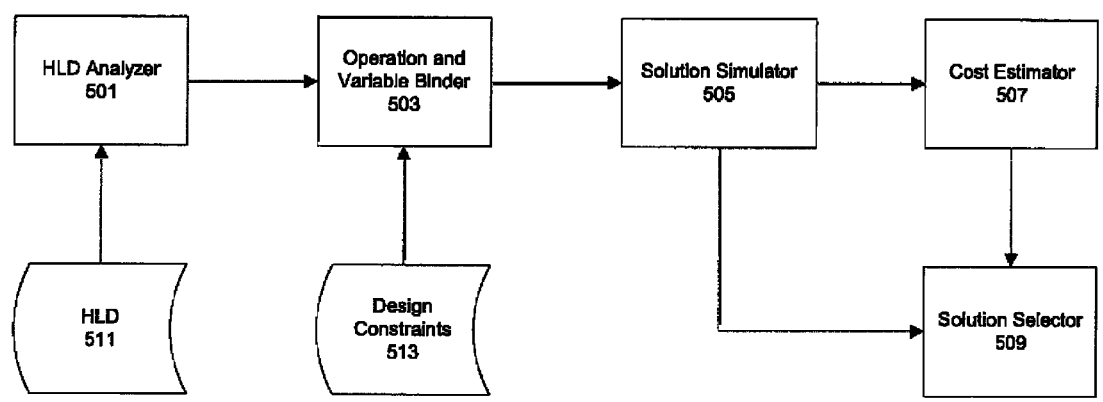
FIG. 5 shows one embodiment of a system for implementing the process of FIG. 5.

FIG. 5 shows one embodiment of frame binder modules for implementing the frame binding process. The system can be implemented as discrete components of an application specific integrated circuit (ASIC), digital signal processor (DSP), or another electronic device. The system may be implemented in a software simulation system running on a computer system. The modules of FIG. 5 include a high level description (HLD) analyzer 501 which is provides its analysis to an operation and variable binder 503. The high level description analyzer 501 initializes all the variables for a data frame, defines operation types, and creates operations for each variable.

The HLD analyzer 501 is supplied by a high level description (HLD) 511. In one embodiment, the HLD 511 can be stored in any type of memory which is available to the HLD analyzer 501 and provides to the operation and variable binder 503, the operations, the variables, and the data frames that are desired for the intended final circuit design. The operation and variable binder 503 binds variables to operations and binds operations to hardware types. In one embodiment, the operation and variable binder 503 is coupled to a stored set of design constraints 513 which establish the desired performance and hardware limitations and any other design considerations intended to apply to the solutions.

The operation and variable binder 503 provides the bound operations and variables to a solutions simulator 505. This simulator 505 creates solutions in the form of hardware modules and hardware connections. The solution in one embodiment can be created by reference to a data flow graph or in a variety of other ways. The solutions from the solutions simulator 505 are in one embodiment supplied to a cost estimator 507 and to a selection module 509. The selection module 509 in one embodiment looks at each of the solutions and the costs of those solutions from the estimator 507 and selects a final design for the integrated circuit design.

As described above, an operation can be selected to be performed by the integrated circuit that is to be designed. This operation can include one or more partial operations of different types. In one example, the operation may be a complex larger operation such as a mathematical algorithm, a conversion, or a transformation, and this operation may include a variety of individual steps within that operation. These individual steps can be treated as separate operations or as partial operations within the overall operation.

The operations and the performance of the circuit can all be described in the high level description. These operations are identified in the HLD, including any partial operations that may be a part of the overall operations. The variables to be used by the operations are identified and ordered based on the times at which the variables will be used by the partial or full operations. The partial operations can be ordered based on the ordering of the variables. Solutions are developed using, for example, a solution simulator which represents different hardware components for performing the operations in any of a variety of different ways. In one embodiment, a data flow graph such as that shown in FIGS. 2 and 3 that has edges and nodes as explained above can be used to simulate solutions.

The edges and nodes are connected based on the ordering of the partial operations. Different solutions can be simulated for performing these operations, in one embodiment. The simulations represent the operations as hardware component combinations and these combinations can be represented as paths on the data flow graphs. For each of these solutions, a cost can be determined so that the different solutions can be compared. The term "cost" can refer to a time to complete the path. The cost can be calculated in a wide range of different ways. A simple approach is to include the number of edges and nodes that are traversed to perform the entire solution on the data flow graph. The solution with the lowest cost can be selected as the hardware component combination for the intended circuit design. In one embodiment, this process can be repeated until all of the operations of the high level description have been characterized and solutions have been found. In another embodiment, a subset of possible solutions may be evaluated.

The ordering of the operations can have a significant impact on the solution. In one embodiment, the operations which produce a variable are ordered after the operations that consume the variable are ordered. In the context of the description above, the consume operations are all defined and ordered first then the source operations are ordered based on the ordering of the consume operations. This helps to ensure that whenever a variable is consumed, the variable has been produced by a prior operation so that the variable is available for consumption.

Virtual Cost in ACO Pheromones

The quality of the resulting circuit depends on the quality of the simulated solutions. With particularly complex circuits, the number of possible solutions becomes very large. Rather than simulate all possible solutions, techniques have been developed to try to simulate only the best solutions. In some techniques, a baseline is established and the process tries to find solutions that are better than the baseline. Another technique for generating candidate solutions is referred to as Ant Colony Optimization (ACO) which attempts to optimize a solution using a technique modeled on how ants optimize a path between their colony and a food source.

Figure 6:
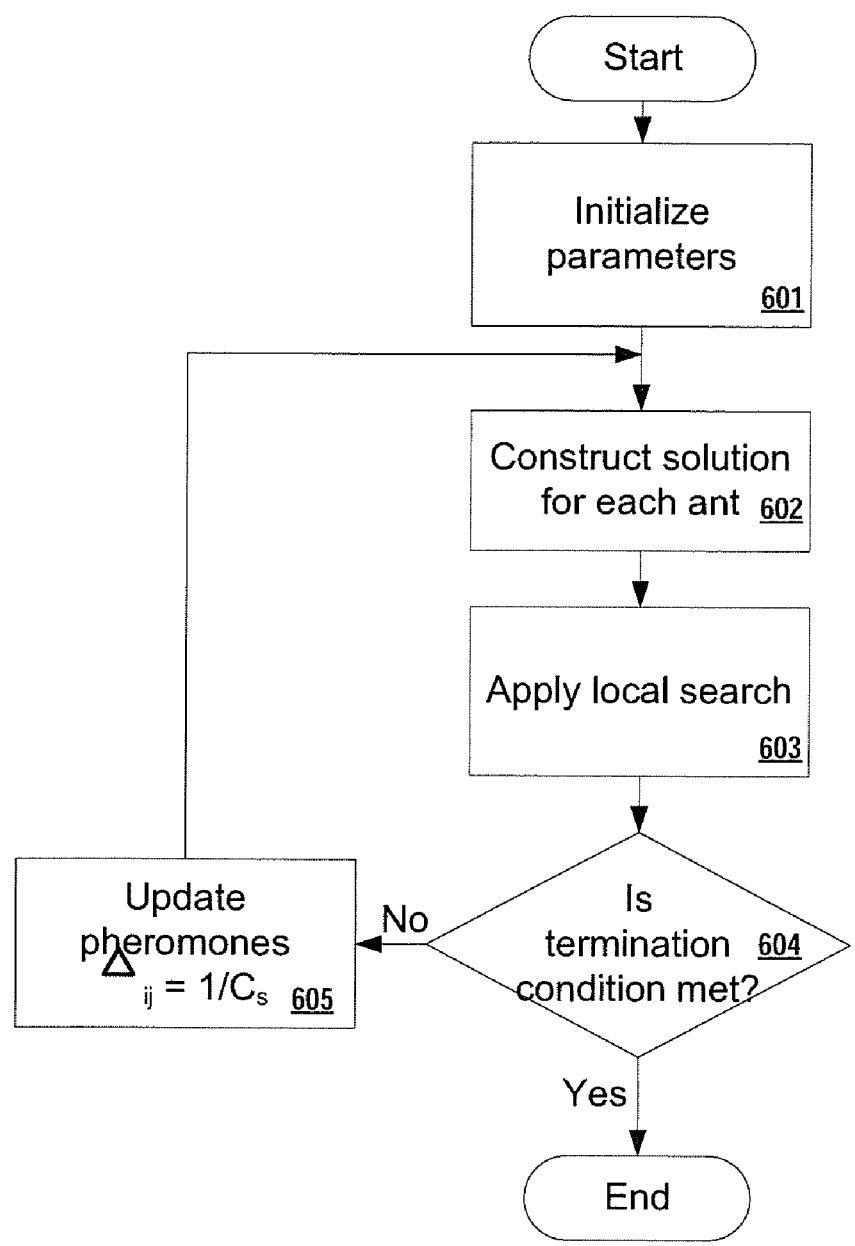
FIG. 6 is an example of a process flow diagram for solving circuit design using ant colony optimization.

FIG. 6 shows a simplified process flow diagram for one embodiment of ACO. In FIG. 6, the parameters of the process are first initialized at 601. In the case of transforming an HLD with high level synthesis (HLS) this initialization can include generating the operations and variables, and creating a net diagram including nodes and edges. One embodiment of the operations included in initialization is described above in the context of FIGS. 4 and 5.

Next a colony of virtual ants is created and a solution to the problem is constructed for each ant at 602. While colonies of several hundred ants have been used, depending on the application ten or fewer will often provide a good result. For each solution a local search is performed at 603. The local search can select additional solutions or paths. For each solution, the corresponding pheromones on the edges used are updated at 605. The process repeats for all of the ants constructed at 602. When enough solutions have been generated at 604, the process ends with a selection of one or more of the solutions based on the strength of the pheromone trail of that solution.

The termination condition at 604 can be based on many different factors. Typically a predefined number of cycles is used. However, the termination condition could be based on the variance in the cost of the solutions, the amount of change in the pheromones, or more complex determinations, such as inflection points and graphed costs for the constructed solutions.

In the example of FIG. 6, the selection of a solution is not shown as a separate block because this is included in the local search at 603. The local search 603 can compare a constructed solution at 602 to previous solutions or to different local possibilities in order to select one or more local solutions for simulation. In doing so, the prior solutions can be compared to the current solution and a current best solution can be determined. The pheromones can be updated based on the difference between the current solutions and the best prior solution. With such a methodology, a best solution is tracked. When the termination condition is met, this best solution can be used as the final result. Alternatively, a separate process (not shown) can be used to examine all of the results and pick a best solution.

In some examples, solutions are produced one at a time. In one embodiment for the example of FIG. 6, at 602, a single solution is constructed and then one or a few neighboring solutions are constructed at 603. After the pheromones associated with the first solution are deposited, then at 605, the pheromones for another solution and its neighbors are deposited. In another embodiment 20 or 30 solutions are constructed at each instance, compared, and then the local search tries to find a better neighboring solution for the best current solution.

While in real ant colonies, each ant leaves pheromones so that later ants can determine which paths have been more popular, in ACO, a cost factor is used as a pheromone to indicate which solutions are preferred. As a result, ACO can solve much more complex path problems with fewer virtual ants than would be required with a real ant colony. In the example of FIG. 6, the pheromones are indicated as a delta factor at 605 which is explained below for particular embodiments of the invention.

Figure 7:
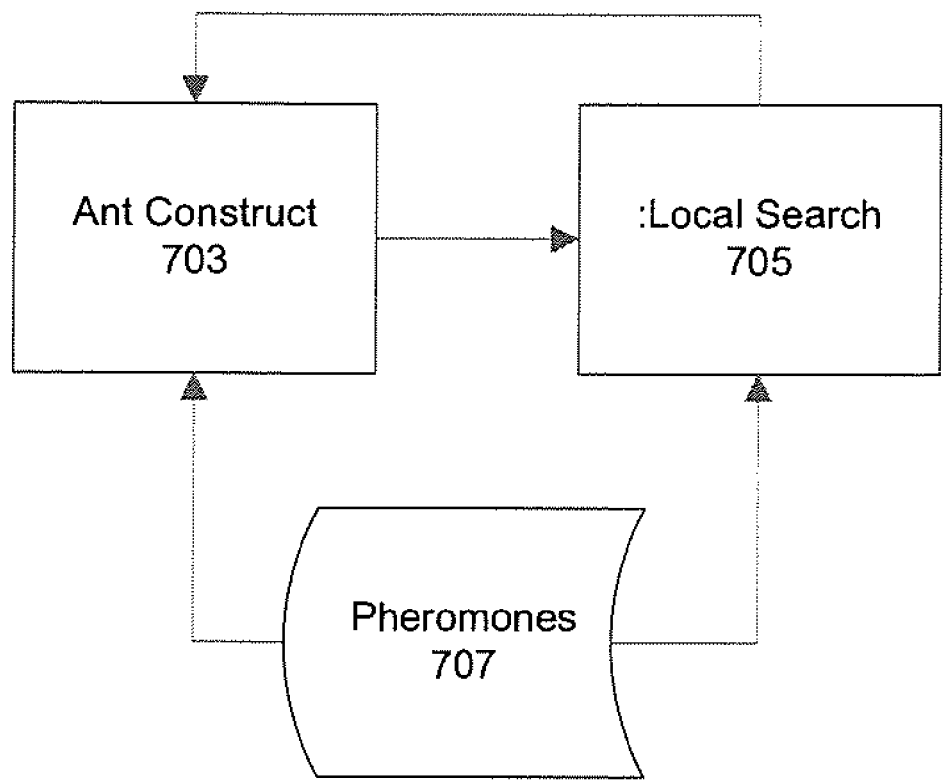
FIG. 7 shows one embodiment of a system for implementing the process of FIG. 6.

The process flow of FIG. 6 can be performed by hardware or software modules as shown in FIG. 7 in one embodiment. As with FIG. 5, these modules can be implemented in hardware as discrete or blended functional blocks of ASIC, DSP, or other circuitry. In another embodiment, these modules can be implemented in software on a computer system. As shown in FIG. 7, an ant construction module 703 generates one or more solutions based on the provided problem constraints. In one embodiment, the solutions are then applied to a local search module 705. This module searches for neighboring solutions that may produce locally better results. In one embodiment, the best local solution selected by the local search module 705 can be fed back to the ant construction module so that a complete solution can be constructed and simulated. In one embodiment, after each solution is simulated in the ant construction module, pheromones are updated and stored in a memory 707. In another embodiment, each new solution is compared to the current best solution, and pheromones are updated based on that comparison. The pheromones can then be used by the ant construction module to build and simulate solutions and by the local search module to help guide the local search. In one embodiment, the entire system described in FIG. 7 corresponds to the solution simulator 505 of FIG. 5.

One application of ACO is for time constrained scheduling (TCS) in the field of integrated circuit design. However, it may be possible to apply ACO to many other aspects of integrated circuit design. TCS tries to reduce the number of resources which are shared among a set of operations within a fixed number of time steps. In the context of traditional TCS, the cost function associated with a schedule is the maximum number of operations scheduled to the same time step.

When applying ACO to TCS, ants tend to collect at local optima. In other words, the process will stagnate when a solution is reached that is better than the neighboring solutions, even when a better solution is available some distance away. The stagnation occurs because of plains (neighborhoods having the same cost function) in the solution space. This has been addressed by trying to better randomize the ants at the solution construction phase. While this can cause the ants to stagnate at several different local optima, it does not cause the ants to try solutions on a different solution plane after they have arrived at a local optimum.

The ants select a solution based on the costs in the local search and the costs in the pheromones. Adjusting these costs can change the behavior of the ants. However, these costs are also used to select the best solution, so any adjustment to the costs should consider its impact on the final design solution choice. In one embodiment, a virtual cost factor is added to the actual cost. The virtual cost factor is designed to change the shape of the solution space. The supplemental virtual cost can be used instead of the improved randomization techniques or as an addition to it, depending on the application. The virtual cost can be used to guide the ants, but not to select a solution. Separating this virtual cost from actual costs can guide the ants within a plain of solutions without affecting the final design choice.

The plains within the solution space are caused by the cost function and are determined by how the cost function is traditionally (and naturally) defined. With a traditional definition, a large set of different but neighboring solutions are expected to have the same maximum number of operations scheduled to the same time step. Since the cost function is expressed as a number of operations, it is an integer and this provides a "terraced landscape" in the solution space. In other words, many neighboring solutions may have the same number of operations in a step, and many other neighboring solutions differ by one in either direction. The cost function does not provide a way to distinguish between different solutions that have the same maximum value for the number of operations.

This "terraced landscape" can be contoured in one embodiment with a sub-integer supplemental cost factor. The sub-integer cost factor can give values between the integer steps in order to give a "natural continuous slope" to the solution space landscape. This allows the ants to use the sub-integer costs for local navigation and be guided towards lower local levels of cost.

A variety of different supplemental cost factors can be used. In one embodiment, the supplemental cost factor is incorporated into the actual cost, supplementing the actual cost. This cost can then not be counted as cost for the solution. In another embodiment, the supplemental cost factor is virtual in the sense that it is not minimized for the final solution. It is used to enhance navigation. This can be done by using it to compare two candidate solutions whose traditionally defined integer costs are equal. The supplemental cost can then be used to favor a solution which is closer to a better solution.

A variety of different costs can be used as a supplemental cost function, such as probabilities, variances, co-variances etc. In one embodiment, a normalized entropy of the histogram of the operations on the time steps (schedules) is used. With normalized entropy of the histogram incorporated into the cost function, the cost for purposes of the pheromones can be calculated as the real cost (maximum number of operations per time step) minus the normalized entropy of the histogram.

In the context of time-constrained-scheduling by ant colony optimization, in one embodiment the ants' search at local optima can be inhibited from stagnating by incorporating this supplemental virtual cost factor into the traditional integer cost function.

A high level pseudo code of a basic ACO algorithm such as that of FIG. 6 can be presented as follows:

```
Initialize parameters
While termination condition is not met do
    Construct solution for each ant
    Apply local search
    Update pheromones
End
```

There are different pheromone update strategies but in the area of TCS, it is common to use a solution (S) cost ($C_s$). In one embodiment, this is applied to determine an incremental value ($\Delta_{ij}$) of a pheromone of an edge ($_{ij}$) between node i and node j in a data flow graph, such as those of FIGS. 2 and 3. The better solution as indicated by the pheromone delta value will be the one that has the smaller delta or the least amount of change. As mentioned above, while the pheromones are helpful in guiding the selection of the next solution to simulate, the final solution is not selected based on pheromones but on actual cost. Due to the integer nature of the actual cost, there may be several solutions with the same lowest cost.

The incremental value $\Delta_{ij}$ can be determined as follows:
$\Delta = 1/C_s$ if ij belongs to S; otherwise 0
In a TCS algorithm the cost of the solution ($C_S$) can be determined as follows:
Create an histogram array (HD) of the operation according to its assigned time steps
Initialize HD to zero
For each operation, increment by one the value of HD [schedule of operation]
$C_S$ is the maximum value in HD
When a supplemental cost is used, the cost can be determined in one embodiment the manner below:
Calculate the histogram (HD) as above
Define X as the time steps, an integer from 0 to tmax (where tmax is the maximum number of time steps or time slots)
Probability P is from histogram; P=HD/N (where N is the number of operations)
Normalized entropy; $H_n(X) = (1/\log(\text{Length}(P))) * \text{Sum}\{\log(P(k))*P(k)\}$, where $k=0 \ldots$ tmax
$C_S = \max\{D\} - H_n$ The pseudocode above may be further illustrated by a concrete example. Consider an HLD which provides that there are 10 operations to be performed and 4 time slots in which to perform them. The timeslots can be labeled 0, 1, 2, 3. In this case N=10, tmax=4.

One solution might have the following schedule of operations (0, 2, 1, 0, 3, 3, 1, 1, 1, 0) where each number corresponds to an operation, and the numerical value corresponds to its timeslot. In this example solution, the operations may be scheduled so that:
3 operations are scheduled to time slot 0, so that HD(0)=3,
4 operations are scheduled to time slot 1, so that HD(1)=4,
1 operations is scheduled to time slot 2, so that HD(2)=1,
2 operations are scheduled to time slot 3, so that HD(3)=2
Therefore the histogram array HD=(3, 4, 1, 2).
The probability or length P=HD/N=HD/10=(0.3, 0.4, 0.1, 0.2). This is the size of the sequence which is 4 which is equal to tmax.
The entropy ($E_n$) then becomes the sum for each of the HD values of $(\log(P(k)))(P(k))$ for k=1 to 4.
The P(k) sequence is (0.3, 0.4, 0.1, 0.2).
Allowing for some rounding, the entropy becomes: (0.15+0.16+0.1+0.14)=0.55.
The normalized entropy ($H_n$) then becomes (1/log 4)*(0.55) or 1.6*0.55=0.88

Since there are no more than 4 operations in any one time step, max{HD} is 4 and the solution cost $C_S$=4−0.88=3.12. Modifying the integer solution cost by the non-integer entropy value allows similar solutions to be differentiated. Of course, the number of decimals or level of precision can be increased to show even larger differences between different solutions. The level of precision can be adapted to suit any particular application. However, in one embodiment, the value of the supplemental cost is small enough that it does not alter the relationship between solutions that already have different costs associated with them. In one embodiment, the value of the supplemental cost is always less than one, since actual costs are calculated as integers. While a particular approach to determining the entropy is provided above, entropy may be determined in a variety of other ways.

Figure 8:
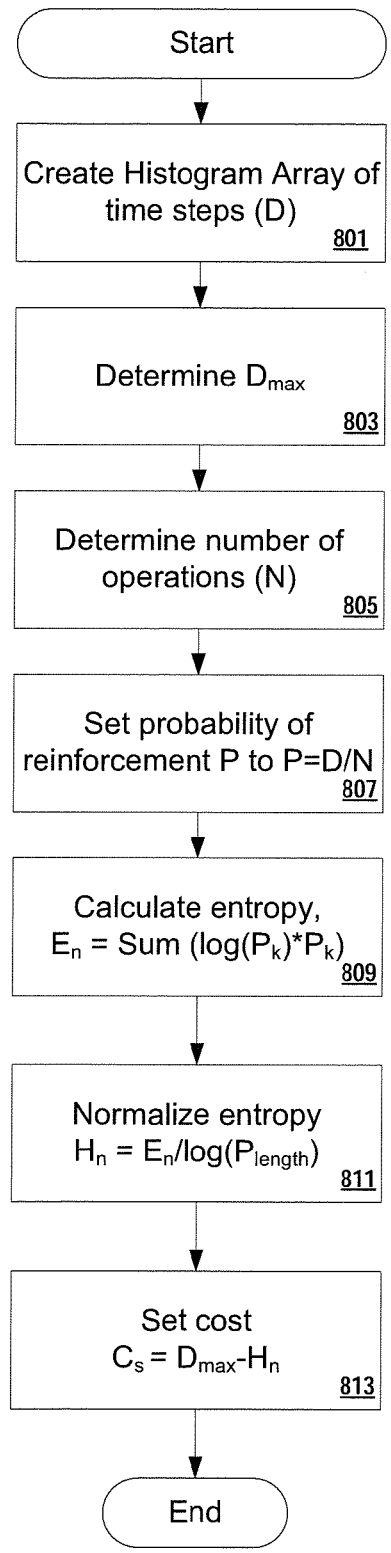
FIG. 8 is an example of a process flow diagram for determining a supplementary cost of a circuit design for use in the process of FIG. 6.

FIG. 8 shows one embodiment of a process flow diagram for calculating a virtual cost. In FIG. 8 at 801 a histogram array of time steps is created. This histogram corresponds, in one embodiment, to the histogram array identified as capital HD in the example above. At 803 the maximum value of HD is determined. At 805 the number of operations is determined. In one embodiment, this is assigned capital value N. At 807 the probability of reinforcement (P) is calculated. The value of P is determined as HD/N.

At 809 these results are used to determine entropy as the sum of logged factors of each of the probabilities for each step. At 811 the entropy can be normalized based on the maximum value for HD, in one embodiment. The entropy may be normalized based on another value, in another embodiment.

At 813 the cost can be determined as a combination of an actual cost and a supplementary cost. In one embodiment, this cost can then be used in the local search to further enhance the selection of solutions. In one embodiment, as shown in the diagram of FIG. 7, the local search 705 can be enhanced with a supplementary cost that is used in a solution simulator for designing an integrated circuit.

Given these applications, the design of an integrated circuit can be enhanced using a supplementary cost. In such a process, the operations from a high level description or some other source are identified and the hardware components for executing these operations are determined. This can be done with a data flow graph or in a variety of other ways. Given the operations and hardware components, a variety of different solutions are simulated for performing these operations.

The solutions are typically represented as hardware component combinations and interconnections, represented as paths on a data flow graph for each solution. A cost is determined and this cost can include not only the number of edge and nodes traversed on a data flow graph, but also the supplemental sub-integer cost such as entropy described above. The optimal solution can then be selected as the solution with the actual lowest cost. In one embodiment, the supplemental cost is not included in this selection. In one embodiment, the supplemental cost is sub-integer and therefore need not be excluded. The supplemental cost can be used in one embodiment for supplementing pheromone values in an ant colony optimization technique.

Folding Transformations

Another technique that can be used in HLS is folding transformation. Rather than provide a unique hardware component for every partial operation to be performed by a circuit, a circuit can be designed so that the same hardware components can be used by different operations in different time steps. Paths are folded back to the same hardware component when the HLD is transformed through HLS. This allows the total number of hardware components to be reduced. Folding transformation allows hardware units of a system to be shared among multiple operations of the behavioral descriptions by time multiplexing. In other words, processes are folded back to a single hardware component, so that the component serves different parts of different processes at different times.

Folding depends upon the scheduling of operations and the binding of operations to particular hardware components. Scheduling can be considered to be a pre-process for folding and binding can be considered a primary sub-process of folding. For each operation, a scheduling algorithm can determine a time step at which the operation is executed and a binding algorithm can determine a hardware unit upon which the operation is executed.

With time-constrained scheduling, the number of operations executed during any one time step can be minimized. This reduces the total number of hardware units needed to support each time step. With fewer operations, folding becomes easier, further enhancing the potential cost reductions. The binding algorithm can be used in one embodiment to minimize the number of interconnections between hardware components. This can reduce the cost of the hardware units and the overall circuit design. The interconnection cost in one embodiment includes routing registers and the multiplexing logic to route data from one operation to another.

For folding to reduce the cost or increase the efficiency of a circuit, it must be designed with scheduling and binding in mind. Scheduling is typically determined before binding. Folding requires more interconnections and folding determines, in part, the binding of operations to hardware components. As a result, all of these operations are interrelated in one embodiment. The relationships can be accommodated using iteration or using determinative processes. They can also be accommodated with Ant Colony Optimization (ACO).

The results from ACO can be improved by adding some functions to the basic ACO routine described, for example, in the context of FIG. 6. In the examples below, an interconnection cost function, a guiding function, and a local search neighbor selection function are described. These functions, in one embodiment, are combined to better consider interconnections when adding folding to a circuit design. While all three functions work well together, any one or more of the three functions can be used without the others depending on the particular application.

The interconnection cost function is related to the number of pairs of candidate folding edges and folding weights. The guiding function is related to a density function (ED) based on the probability of a candidate folding edge and folding weight pair in an unscheduled netlist. The neighbor selection function is related to the change of this density in edges connected to neighboring solutions. This density function can be referred to as an edge density (ED) because it is defined for edges. The density can be used to analyze and compare the numbers of edges of different solutions. These functions are described in more detail below.

The particular names of these functions are chosen to allow the functions to be identified and distinguished. The names and many aspects of the functions can be modified to suit different applications. These functions allow the simulated solutions to take into account the interconnection multiplexing cost during the scheduling, so that the output of scheduling is suitable to also minimize the interconnection cost.

For any particular circuit design, the actual interconnection cost occurs as a result of the communication buses, registers, timing gates, multiplexers, and similar components that are required to interconnect the hardware components of the circuit. Any circuit with an input and an output will have some cost for making connections. However, with folding, the number of hardware components required can be decreased but the interconnection cost can be significantly increased. The examples below are described in the context of solutions with folding, but can also be adapted to other types of circuit simulation.

Interconnection Cost and Folding Transformations

The interconnection cost is a real cost incurred in any circuit, as mentioned above. However, at the scheduling phase, the actual interconnection cost cannot yet be determined. The actual interconnection cost depends upon the binding results which are not known until after scheduling is determined. An estimate can be made at the scheduling phase and this can be used in an ACO context to guide the selection of candidate solutions and also to guide the final selection of a solution. In this way, interconnection cost is considered even if it is not precisely determined. In the context of FIG. 6, in one embodiment the estimated interconnection cost can be used to select local solutions at 603, and can also be used to enhance the effectiveness of the pheromones at 605.

For the scheduling phase, the interconnection cost can be estimated using a candidate folded edge (cfe) and a folding weight (fw). The number of different (cfe, fw) pairs can be taken as an estimate of the cost of the interconnection from multiplexing and other sources. The cfe is a candidate edge from a data flow graph in the final folded design. A folded weight (fw) is the weight (w) of an edge (e) in the folded design and it is determined according to the folding formulation. This weight can be used as a weight factor to scale the interconnection cost when it is added to the scheduling cost. In one embodiment, the weight is determined by the number of registers or delay states on the respective edge. This weight (w) corresponds to the weight w discussed above with respect to creating the netlist.

Folding can be viewed as a function or a transformation which transforms a base design to a folded design. The aim of this transformation is to reduce the number of hardware components. This typically reduces the design area or the amount of space required for all of the components of the circuit. The circuit design as shown in FIGS. 2 and 3 can be represented as a data flow graph or netlist structure with (V, E, w).

The netlist is a list of the logic gates of a circuit and their interconnections. It can be represented as a data flow graph. In the netlist structure, V is the set of nodes v. A node in the base design before operations are bound to hardware refers to an operation. In the final folded design, the nodes refer to hardware units (HU). E is the set of edges e. An edge is a connection from one output port of an operation to an input port of another operation as shown in FIGS. 2 and 3. Each edge can be represented in the netlist by a quadruple with e=(sourceOperation, sourcePortAddress, targetOperation, targetPortAddress). Variable w is a function (w:=E→int) which gives the number of registers on an edge.

Scheduling in one embodiment determines the time step when each operation is executed. The time step assigned to an operation is called the schedule of the operation. Binding determines the hardware unit in which the scheduled operation is executed. If the scheduling is determined then the weight (fw) of the edge for the folded netlist can be calculated for a particular edge e, which is a part of the set of edges E (e∈E), using a function referred to herein as FW.

In one example, $$FW(e) := w(e) * foldingFactor + schedule(e.targetOperation) - schedule(e.sourceOperation)$$

where schedule (operation) refers to the time step at which an operation is scheduled to be performed. This is typically indicated by an integer count of the sequence of time steps.

To represent the interconnection cost at the scheduling phase, a candidate folded edge (cfe) can be defined. An edge definition for an edge of a final folded design netlist can be defined as being a connection from one hardware unit to another hardware unit. This is what is shown in e.g. FIG. 3. However, for the cfe, the hardware units are not yet bound to any operations, so the cfe is defined by source and destination hardware unit types instead. In other words, the cfe is a pair (source hardware unit type, destination hardware unit type).

Another function, edge to candidate folding edge (e2cfe), can be defined (E→CFE) to determine corresponding cfe's for a given edge (e∈E) of the base design. In such a definition, E>CFE, that is the number of edges, e, exceeds the number of candidate folding edges, cfe.

The edge to candidate folding edge function (e2cfe) can be determined by comparing hardware unite types to the underlying operations. To determine the e2cfe function, cfe.sourceHarwareUnitType=type of e.sourceOperation, and cfe.destinationHardwareUnitType=type of e.targetOperation. In other words, the e2cfe function is determined based on the operations between the source operation and the destination operation on either side of a candidate folding edge.

For a base netlist where the schedule of operations are determined, the number of different (cfe, fw) pairs can be used as an interconnection cost function. In one embodiment, the number of different (cfe, fw) pairs can be used as an estimate of an actual interconnection cost.

Below is a pseudocode example of calculating interconnection cost. In this case, CFE_FW is a set of individual (cfe, fw) pairs.

The total interconnection cost can then be estimated as follows:

Total cost=$C_S$+interconnection cost, where T ∈ set of hardware unit types.

Where $C_S$ is the solution cost determined above in the context of time constrained scheduling (TCS) using and colony optimization (ACO)

Guiding Local Search in Folding Transformation

In one embodiment, the interconnection cost can be used in the solution construction phase of the ACO. This is shown, in one embodiment, in FIG. 6 as constructing a solution for each ant, 602. A guiding function can be used in this phase to guide the construction of the solution. A variety of different functions can be used. In one embodiment, described below, a heuristic value is used to guide the ants when they are constructing a solution. Another density function (ND) can be defined which gives the probability of the realization of a candidate folding edge, folding weight (cfe, fw) pair in an unscheduled netlist. This density can be referred to as a node density. In this node entropy calculation uniformity is improved using the node density function, but in the interconnection cost case, all density is collected on some points which is the inverse of uniformity. In one example, the maximum of the node density value for an edge can be used as the heuristic value.

In the sub-process "construct solution" 602, in one embodiment, each ant generates a schedule solution. During the generation of a solution, probabilities of choices are determined by the strength of the pheromones on a particular portion of the path. These probabilities can be modified by the guiding function. This guiding function accommodates the interconnection cost by guiding the ants to a schedule which generates the most frequently used (cfe, fw) pairs.

One embodiment of a node density function is defined in the pseudocode below. In this example, ASAP is a function which gives the minimum feasible schedule value for a given operation. ASAP can be determined as the earliest schedule for an operation which does not contradict with feasibility constraints. For example, any values used in an operation must be generated prior to the operation taking place. Similarly ALAP is a function which gives the maximum feasible schedule value for a given operation. ALAP can be determined as the latest schedule for an operation which does not contradict with feasibility constraints. For example, if the results of an operation are used by a subsequent operation, the operation must occur prior to that subsequent operation. These functions may be determined in any of a variety of ways well known in the art.

```
Create table ND of size 2*|E|*FoldingFactor
Reset all values of ND to zero.
for each e ∈ E
do
        maxFW = w(e)*FoldingFactor – ASAP(e.sourceOperation) +
        ALAP(e.targetOperation)
        minFW = MAX(0, w(e)*FoldingFactor –
        ALAP(e.sourceOperation) + ASAP(e.targetOperation))
        for each fw in [minFW, maxFW]
        do
                index = h(e2cfe(e), fw)
                ND[index] = ND[index] + 1 / (maxFW – minFW + 1)
        end
end
```

A guiding function which determines the heuristic value of setting the schedule of an operation to a particular selected schedule (sched) can be determined in one embodiment as provided in the pseudocode below.

```
GUIDING-FUNCTION(o ∈ V , sched ∈ int, double table ND)
        heuristicValue = 0
        for each e ∈ E
        do
        if(e.sourceOperation is equal to o or e.targetOperation is equal
        to o)
                if(e.sourceOperation is equal to o)
                        maxFW = w(e)*FoldingFactor – sched +
                        ALAP(e.targetOperation)
                        minFW = MAX(0, w(e)*FoldingFactor – sched +
                        ASAP(e.targetOperation))
                else
                        maxFW = w(e)*FoldingFactor –
                        ASAP(e.sourceOperation) + sched
                        minFW = MAX(0, w(e)*FoldingFactor –
                        ALAP(e.sourceOperation) + sched)
                for each fw in [minFW, maxFW]
                do
                        index = h(e2cfe(e), fw)
                        heuristicValue = MAX(heuristicValue, ND[index])
                end
        end
end
return heuristicValue
```

The total heuristic value can be calculated as:

total heuristic value=(heuristic value for HU)*(heuristic value for interconnection)

The heuristic value for each interconnection is calculated, in one embodiment.

Neighbor Selection and Folding Transformation

In one embodiment, the local search 603 of FIG. 6 can be improved by considering the interconnection cost. A significant part of the local search is to select a particular neighbor to compare against. Calculating the cost for all of the possible neighboring solutions can be complex and time-consuming. A neighbor selection function can produce similar results more simply and in less time. In the embodiment described below, the neighbor selection function uses the change in density of the edges that connect an operation. The neighbor selection function seeks to have more use of each interconnection. As a result, there may be fewer total interconnections in the final design. This is represented as a density value (ID).

In some versions of ACO, local search starts with a current or a best solution and searches for a better solution by evaluating neighboring solutions and moving to the best neighboring solution. Neighbors can be defined in different ways. One simple definition that will be used here for illustrative purposes is that if the only difference between solution A and solution B is a schedule of one operation then A and B are neighbors. In other words, solution A can be achieved by changing the scheduling of only one operation in solution B.

In any real solution system, there will generally be several neighbors so the local search selects a particular one or more neighbors to evaluate. Rather than calculating the cost of all of the neighbors, the move which has the maximum value of the selection function can be chosen for comparison. In one embodiment, this function is a density function (ID), defined from a (cfe, fw) pair to a double (CFE x int→double). If all the schedules are determined, the density function gives an integer value which shows how many base design edges are mapped to a (cfe, fw) pair. Since in the context of local search all the schedules are determined, in one embodiment densities are integer values.

If all of the schedules are not determined, then in one embodiment the output of the density function (ID) is a higher precision floating point number such as a double value, an integer, or a standard floating point decimal. This is described above in the context of defining the node density function.

A hash function (h) can be used in one embodiment to generate a unique index for each (cfe, fw) pair. The particular hash function can be selected based on the particular application and the level of precision desired. The output of h(cfe, fw) is an integer from 0 up to 2*|E|*FoldingFactor. The FoldingFactor is a given value which defines the maximum possible number of operations shared by a single hardware unit. In one embodiment, I Density values (ID) for a schedule solution can be calculated as described in the following pseudocode example:

```
Create table ID of size 2*|E|*FoldingFactor
Reset all values of ID to zero.
for each e ∈ E
do
        index = h(e2cfe(e), FW(e))
        ID[index] = ID[index] + 1
end
```

A selection function for changing an operation (o) schedule to a new schedule (newSched) can be represented in one embodiment as pseudocode as follows:

```
SELECTION-FUNCTION(o ∈ V , newSched ∈ int, double table
ID, maxDensity ∈ int)
selectionValue = 0
for each e ∈ E
do
```

```
        if(e.sourceOperation is equal to o or e.targetOperation is equal
        to o)
        do
                preDensity = ID(h(e2cfe(e), FW(e)))
                if(e.sourceOperation is equal to o)
                        postFw = FW(e) + schedule(o) – newSched
                else
                        postFw = FW(e) – schedule(o) + newSched
                postDensity = ID(h(e2cfe(e), postFw))
                if(postDensity + 1 > preDensity)
                        direction = +1
                else if(postDensity + 1 is equal to preDensity)
                        direction = 0
                else
                        direction = –1
                selectionValue = selectionValue + direction * (maxDensity –
                MIN(preDensity, postDensity))
        end
end
return selectionValue
```

Figure 9:
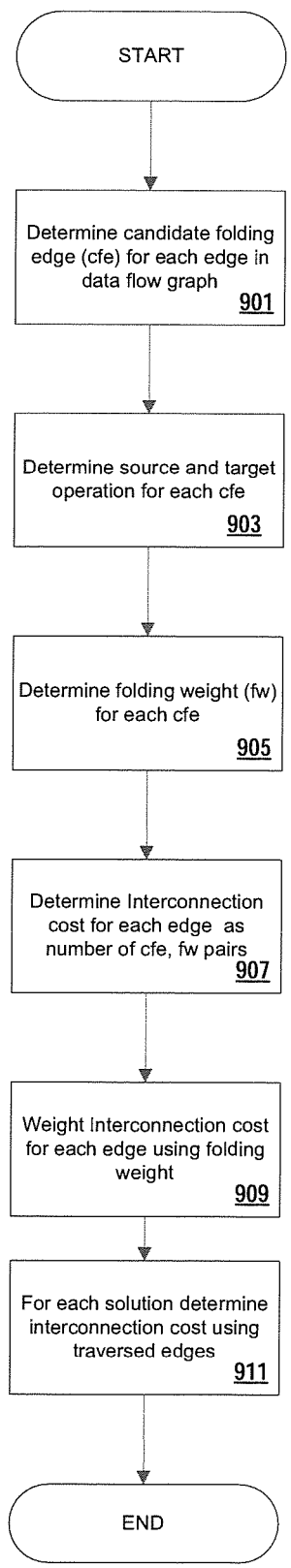
FIG. 9 is an example of a process flow diagram of estimating an interconnection cost for use in the process of FIG. 6.

FIG. 9 is a process flow diagram of one embodiment of estimating an interconnection cost. The process, in one embodiment, corresponds to the pseudocode representation described above. The interconnection cost can be used, as mentioned above, for updating pheromones and for selecting neighbor solutions, for example in the process flow of FIG. 6.

At 901, candidate folding edges are determined for each edge in a data flow graph for a potential solution. At 903, the source and target operations for each candidate folding edge (cfe) are determined. At 905, a folding weight (fw) is determined for each candidate folding edge using the source and target operations.

At 907, given the cfe and the fw, an interconnection cost can be determined for each edge of a solution based on the number of cfe, fw pairs associated with the edge. At 909, the interconnection cost can be weighted for each edge using the folding weight for that edge. At 911, the total interconnection cost is determined by adding up the values for all of the edges that are traversed for the solution. In one embodiment, these operations can be applied to the general integrated circuit design process of FIG. 2 in selecting hardware component combinations 210. In the ant colony optimization of FIG. 6 in one embodiment these operations can be applied to updating pheromones as well as in the local search.

In one example, the use of an interconnection cost can begin with a high level description which includes one or more operations to be performed by the circuit that is being designed. A data flow graph or some other representation can be used to represent the hardware components that will be performing the operations. Different solutions are then simulated for performing the operations in the HLD. These solutions can be simulated as hardware component and schedule combinations. In the case of a data flow graph, in one embodiment the combinations are represented as paths on the data flow graph.

Then for each solution, a cost is determined that includes, for example, the number of edges and nodes traversed on the data flow graph. This cost can be augmented with the interconnection cost, determined with the process flow diagram of FIG. 9 for example. The interconnection cost, as explained above, is related to the number of different hardware components in the path. A pheromone trail can also be associated with each path which includes a cost of the respective scheduling solution. The solution with the highest value pheromone trail can then be selected as a hardware and schedule combination for the circuit. As indicated in FIG. 2, this can be repeated until all of the operations are scheduled and bound to hardware.

The candidate folding edges of FIG. 9 provide a way to represent the steps for each solution. For a folding solution, each candidate folding edge can have a source hardware type paired with a destination hardware type and be represented as an edge on the data flow graph. In one embodiment, the interconnection cost can be weighted by the number of different types of hardware units used by the solution. In one embodiment, this weight can represent the number of different types of hardware units as a ratio of the number of hardware types for one solution to the total number of different hardware types in the data flow graph. The interconnection cost can also be weighted by the number of registers used to perform the simulated solution. In one embodiment, the interconnection cost can further be weighted by a folding factor that is related to the reuse of hardware resources. In one embodiment, the interconnection cost can further be weighted by a number of time steps to perform the simulated solution.

Figure 10:
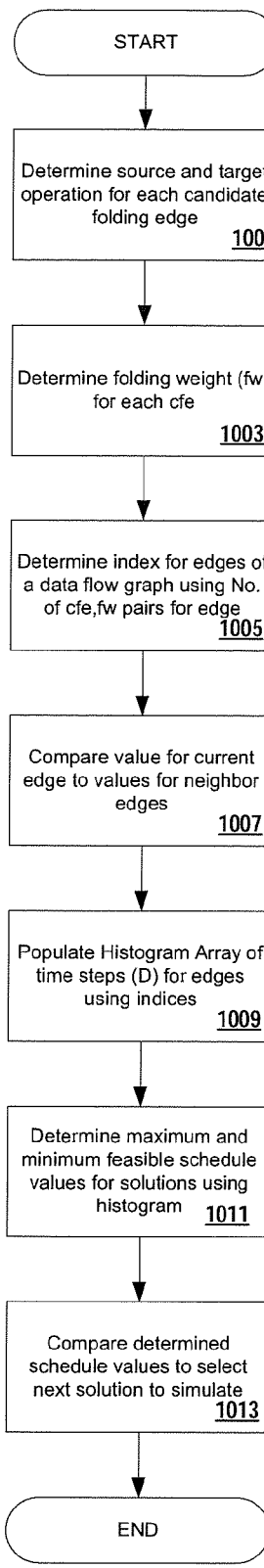
FIG. 10 is an example of a process flow diagram of determining a guiding function for selecting solutions for use in the process of FIG. 6.

A guiding function in one embodiment can be determined using the process flow diagram of FIG. 10. In FIG. 10 at 1001, the source and target operations are determined for each candidate folding edge. At 1003, the folding weight is determined for each candidate folding edge. These operations are similar to the operations 901 and 903 of FIG. 9 and in one embodiment the same values can be used reducing calculation steps and the complexity of the overall solution. At 1005, an index can be determined for edges of the data flow graph using the number of (cfe, fw) pairs for each edge. An index is a unique value, in one embodiment determined using a hash function.

At 1007, the values for the current edge are compared to values for neighboring edges. At 1009, this comparison can be used to populate a histogram array of time steps for the edges. At 1011, the maximum and minimum feasible schedule values are determined using the histogram. This maximum and minimum can represent the highest and lowest number of time steps for the edges of each solution. At 1013, these determined schedule values can be used to select the next solution to simulate. The comparison of the determined schedule values can be used, in one embodiment, to guide the selection of the next solution in a local search, such as the one shown in FIG. 6. Such a local search in FIG. 2 can in one embodiment guide the determination of which hardware component combination to simulate next, as shown in FIG. 2 at 210.

The guiding function of FIG. 10 can be applied to an overall circuit design process as in FIG. 2 by first selecting an operation to be formed by the circuit to be designed. The operation including any partial operations can be represented with nodes on a data flow graph for each of the hardware components performing the operations. Edges can be used for the paths between components. Solutions can then be simulated for performing these operations as hardware component and schedule combinations and represented as particular paths on the data flow graph.

Using the data flow graph, a cost can be determined for each solution which includes for example a number of edges and nodes traversed on the path and any other additional or supplemental costs. For an ant colony optimization routine, a pheromone trail can be associated with each path. Then, in one embodiment, as at 603 of FIG. 6, additional solutions are simulated that neighbor the previous solutions. These solutions can be selected using a neighbor selection function, such as the one discussed with respect to FIG. 10 which is based on a number of operations performed by hardware components that neighbor the hardware units used by a solution. Eventually, a solution with the lowest cost or a low cost can be selected for the integrated circuit design.

The neighbor selection function can be designed to compare the number of operations performed using different schedules that start at different edges on the data flow graph to perform the same operation. This function can be a function of the edge density, or the density of folding operations for each edge that neighbors the initial edge of a respective solution. The next solution to be selected in the local search can be a solution which maximizes the density function that presents the greatest positive change, or presents the greatest difference in the density. Alternatively, the neighbor selection function can determine an index for each edge of the graph based on the number of operations in a particular solution and the amount of folding for each included edge. Then the next solution to be selected can be one that has the highest index of the candidates considered.

Figure 11:
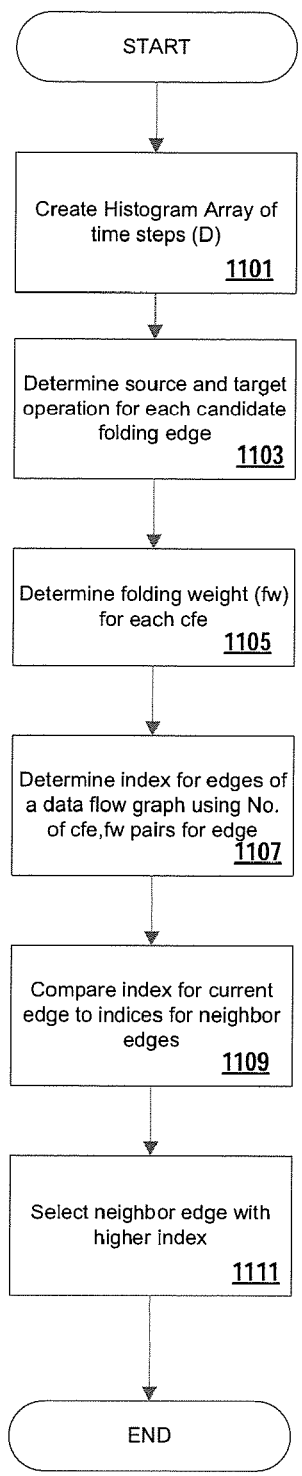
FIG. 11 is an example of a process flow diagram of determining a function for selecting neighbors in a local search for use in the process of FIG. 6.

FIG. 11 shows a process flow diagram of one embodiment for determining a neighbor selection function. This function can be used in the local search 603 of an ant colony optimization for example. At 1101, a histogram array of time steps is determined. At 1103, source and target operations are determined for each candidate folding edge. In one embodiment, prior to this process flow, the folding is determined and candidate folding edges are presented. In one embodiment, the processes described above for FIGS. 9 and 10 may be used to do this.

At 1105, a folding weight is determined for each candidate folding edge and, at 1107, indices are determined for the edges of the data flow graph. These indices can be determined using the number of (cfe, fw) pairs for each edge. At 1109, the index for a current edge is compared to indices for neighboring edges and at 1111, using this comparison, the neighboring edge with the highest index can be selected as the next solution to simulate. This process can be repeated to evaluate additional solutions.

In the context of FIG. 11, an integrated circuit design can be augmented with a guiding function. As mentioned before, the operations to be performed by the integrated circuit design are characterized, for example, using high level description and the hardware components for performing this operation can be represented on a data flow graph with edges between the hardware components. The guiding function can be used to select from among different solutions for performing the operations. The solutions, similar to those described above with respect to FIGS. 9 and 10, can be represented as hardware components and schedule combinations represented on the graph. The costs for each simulation are determined and then a solution with the lowest cost is selected. The guiding function can be related to the amount of hardware reuse on an edge of the data flow graph for the particular solution. This can be combined with pheromone trails to select a solution with a lower cost.

This description and drawings are illustrative of embodiments of the invention and are not to be construed as limiting the invention. Numerous specific details are described to provide a thorough understanding of the disclosed embodiments. However, in certain instances, well known or conventional details are not described in order to avoid obscuring the description of the disclosed embodiments. References to an or one embodiment in the present disclosure are not necessarily to the same embodiment; and, such references mean at least one.

In the present description and in the claims, a register refers to a sequential element in general (e.g., a delay element, a memory cell, a flip-flop, or others). A register samples and holds (stores) the input signal so that it can be output in synchronization with the clock of the circuit. Further, it is understood that one delay on an edge of a data flow graph represents a unit of latency typically introduced by the presence of a register on the corresponding path. However, the unit of latency can also be introduced through other means, such as different control signals for reading a memory cell, multiplexers, dividers, or path delays.

Many of the methods of the disclosed embodiments may be performed with a digital processing system, such as a conventional, general-purpose computer system. Special purpose computers, which are designed or programmed to perform only one function, may also be used.

Figure 12:
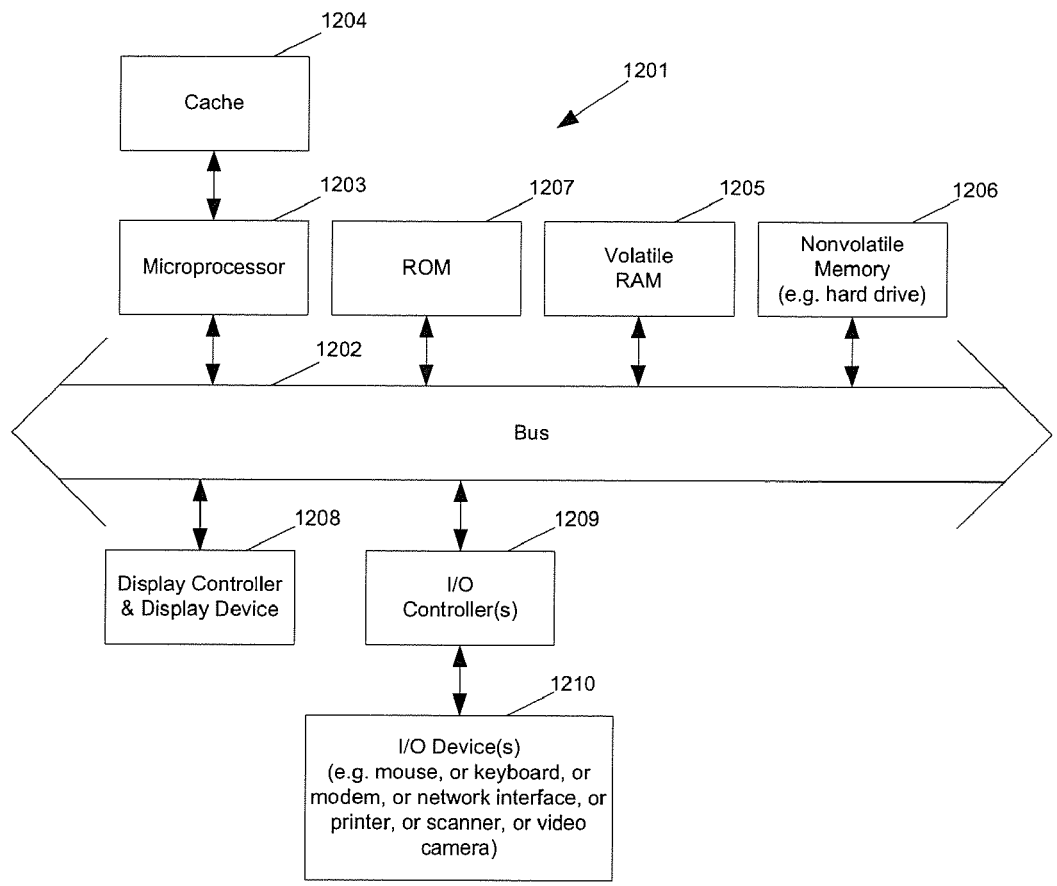
FIG. 12 is a block diagram example of a data processing system configured for use with the disclosed embodiments.

FIG. 12 shows one example of a typical computer system which may be used with the disclosed embodiments. For example, it is noted that the processes described with respect to FIGS. 1-4, 6, and 8-11 are operational through the example computing system. In addition, the modules described in FIGS. 5 and 7 are configurable in a data processing system structured similar to the example computing system. However, it is noted that while FIG. 12 illustrates various components of a computer system, it is not intended to represent any particular architecture or manner of interconnecting the components but rather provides an example representation of how the components and architecture may be configured. It will also be appreciated that network computers and other data processing systems which have fewer components or perhaps more components may also be used with the disclosed embodiments. The computer system of FIG. 12 may be any computing system capable of performing the described operations.

As shown in FIG. 12, the computer system 1201, which is a form of a data processing system, includes a bus 1202 which is coupled to a microprocessor 1203. In one embodiment, computer system 1201 includes one or more of a read only memory (ROM) 1207, volatile memory (RAM) 1205, and a non-volatile memory (EEPROM, Flash) 1206. The microprocessor 1203 is coupled to cache memory 1204 as shown in the example of FIG. 12. Cache memory 1204 may be volatile or non-volatile memory.

The bus 1202 interconnects these various components together and in one embodiment interconnects these components 1203, 1207, 1205, and 1206 to a display controller and display device 1208. The computer system 1201 may further include peripheral devices such as input/output (I/O) devices which may be mice, keyboards, modems, network interfaces, printers, scanners, video cameras and other devices which are well known in the art. Typically, the input/output devices 1210 are coupled to the system through input/output controllers 1209.

The volatile RAM 1205 is typically implemented as dynamic RAM (DRAM) which requires power continually in order to refresh or maintain data in the memory. The non-volatile memory 1206 is typically a magnetic hard drive, magnetic optical drive, an optical drive, a DVD RAM, a Flash memory, or other type of memory system which maintains data even after power is removed from the system. Typically, the non-volatile memory will also be a random access memory although this is not required.

While FIG. 12 shows that the non-volatile memory is a local device coupled directly to the rest of the components in the data processing system, it will be appreciated that the disclosed embodiments may utilize a non-volatile memory which is remote from the system, such as a network storage device which is coupled to the data processing system through a network interface such as a modem or Ethernet interface.

The bus 1202 may include one or more buses connected to each other through various bridges, controllers and/or adapters as is well known in the art. In one embodiment the I/O controller 1209 includes a USB (Universal Serial Bus) adapter for controlling USB peripherals, and/or an IEEE-1394 bus adapter for controlling IEEE-1394 peripherals.

It will be apparent from this description that aspects of the disclosed embodiments may be embodied, at least in part, in software (or computer-readable instructions). That is, the techniques, for example the processes of FIGS. 1-4, 6, and 8-11, may be carried out in a computer system or other data processing system in response to its processor, such as a microprocessor, executing sequences of instructions contained in a memory, such as ROM 1207, volatile RAM 1205, non-volatile memory 1206, cache 1204 or a remote storage device. In various embodiments, hardwired circuitry may be used in combination with software instructions to implement the disclosed embodiments. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 1203.

A machine readable medium can be used to store software and data which when executed by a data processing system causes the system to perform various methods of the disclosed embodiments. This executable software and data may be stored in various places including for example ROM 1207, volatile RAM 1205, non-volatile memory 1206 and/or cache 1204 as shown in FIG. 12. Portions of this software and/or data may be stored in any one of these storage devices.

Thus, a machine readable medium includes any mechanism that stores any information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.).

In the foregoing specification, the disclosed embodiments have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:
1. A method comprising:
selecting an operation to be performed by a circuit, the operation including a plurality of partial operations of different types;
identifying variables to be used by the plurality of partial operations;
ordering the variables based on a time order in which the variables are used by the plurality of partial operations;
ordering the plurality of partial operations based on the ordering of the variables;
representing a plurality of hardware components for performing the operations with a data flow graph having edges and nodes, the edges and nodes being connected based on the ordering of the plurality of partial operations;

simulating a plurality of solutions for performing the operations, each solution corresponding to a hardware component combination represented as a path on the data flow graph;

determining a cost for each solution, each cost including a number of edges and nodes traversed on the data flow graph for a path corresponding to the respective solution; and selecting a solution with a lowest cost as a hardware component combination for a circuit.

2. The method of claim 1, wherein ordering the partial operations further comprises ordering partial operations which produce a variable after partial operations which consume the variable.

3. The method of claim 2, wherein representing comprises creating an edge in the data flow graph between a partial operation that produces the variable and a partial operation that consumes the variable.

4. The method of claim 1, wherein representing comprises associating each type of partial operation with a type of hardware component capable of performing the partial operation and anchoring partial operations with a node corresponding to the associated type of hardware component.

5. The method of claim 1, wherein identifying comprises creating a partial operation for each variable.

6. A non-transitory computer-readable medium storing instructions thereon, the instructions when executed by a processor causing the processor to:

select an operation to be performed by a circuit, the operation including a plurality of partial operations of different types;

identify variables to be used by the plurality of partial operations;

order the variables based on a time order in which the variables are used by the plurality of partial operations;

order the plurality of partial operations based on the ordering of the variables;

represent a plurality of hardware components for performing the operations with a data flow graph having edges and nodes, the edges and nodes being connected based on the ordering of the plurality of partial operations;

simulate a plurality of solutions for performing the operations as hardware component combinations represented as paths on the data flow graph;

determine a cost for each solution, each cost including a number of edges and nodes traversed on the data flow graph for a path corresponding to the respective solution; and selecting a solution with a lowest cost as a hardware component combination for a circuit.

7. The computer-readable medium of claim 6, wherein ordering the partial operations further comprises ordering partial operations which produce a variable after partial operations which consume the variable.

8. The computer-readable medium of claim 7, wherein representing comprises creating an edge in the data flow graph between a partial operation that produces the variable and a partial operation that consumes the variable.

9. The computer-readable medium of claim 6, wherein representing comprises associating each type of partial operation with a type of hardware component capable of performing the partial operation and anchoring partial operations with a node corresponding to the associated type of hardware component.

10. The computer-readable medium of claim 6, wherein identifying comprises creating a partial operation for each variable.

11. A digital processing system comprising:

means for selecting an operation to be performed by a circuit, the operation including a plurality of partial operations of different types;

means for identifying variables to be used by the plurality of partial operations;

means for ordering the variables based on a time order in which the variables are used by the plurality of partial operations;

means for ordering the plurality of partial operations based on the ordering of the variables;

means for representing a plurality of hardware components for performing the operations with a data flow graph having edges and nodes, the edges and nodes being connected based on the ordering of the plurality of partial operations;

means for simulating a plurality of solutions for performing the operations, each solution corresponding to a hardware component combination represented as a path on the data flow graph;

means for determining a cost for each solution, the cost including a number of edges and nodes traversed on the data flow graph for a path corresponding to the respective solution; and means for selecting a solution with a lowest cost as a hardware component combination for a circuit.

12. The system of claim 11, wherein the means for ordering the plurality of partial operations further comprises means for ordering partial operations which produce a variable after partial operations which consume the variable.

13. The system of claim 12, wherein the means for representing comprises means for creating an edge in the data flow graph between a partial operation that produces the variable and a partial operation that consumes the variable.

14. The system of claim 11, wherein the means for representing comprises means for associating each type of partial operation with a type of hardware component capable of performing the partial operation and anchoring partial operations with a node corresponding to the associated type of hardware component.

15. The system of claim 11, wherein the means for identifying comprises means for creating a partial operation for each variable.

* * * * *